United States Patent [19]
Love, Jr. et al.

[11] Patent Number: 6,033,993
[45] Date of Patent: Mar. 7, 2000

[54] PROCESS FOR REMOVING RESIDUES FROM A SEMICONDUCTOR SUBSTRATE

[75] Inventors: M. Lee Love, Jr., Mesa, Ariz.; Kenji Honda, Barrington, R.I.

[73] Assignee: Olin Microelectronic Chemicals, Inc., Norwalk, Conn.

[21] Appl. No.: 08/936,035

[22] Filed: Sep. 23, 1997

[51] Int. Cl.$^7$ ..................... H01L 21/3105; H01L 21/312
[52] U.S. Cl. ..................... 438/745; 510/175; 510/176; 510/255
[58] Field of Search ..................... 438/725, 750, 438/745; 216/96; 134/1.2; 510/175, 176, 255

[56] References Cited

U.S. PATENT DOCUMENTS

| | | | |
|---|---|---|---|
| 4,786,578 | 11/1988 | Neissius et al. | 430/256 |
| 4,824,762 | 4/1989 | Kobayashi et al. | 430/258 |
| 5,174,816 | 12/1992 | Aoyama et al. | 106/103 |
| 5,279,771 | 1/1994 | Lee | 510/212 |
| 5,472,830 | 12/1995 | Honda | 510/176 |
| 5,529,637 | 6/1996 | Honda et al. | 134/3 |
| 5,612,304 | 3/1997 | Honda et al. | 510/176 |
| 5,878,406 | 7/1998 | Honda et al. | 510/175 |

*Primary Examiner*—Benjamin Utech
*Assistant Examiner*—Lynette T. Umez-Eronini
*Attorney, Agent, or Firm*—Ohlandt, Greeley, Ruggiero & Perle

[57] ABSTRACT

A process of treating a substrate having photoresist applied thereto, comprising the steps of:

(a) removing said photoresist from said substrate by a method selected from the group consisting of photoresist stripping, plasma etch residue cleaning, or a combination thereof; and (b) rinsing said substrate with a non-corrosive rinsing composition comprising
 (1) water; and
 (2) one or more water-soluble corrosion inhibitors selected from the group consisting essentially of hydroxylamine, at least one hydroxylammonium salt, at least one water-soluble organic acid, at least one amino acid, and combinations thereof.

22 Claims, No Drawings

PROCESS FOR REMOVING RESIDUES FROM A SEMICONDUCTOR SUBSTRATE

BACKGROUND OF THE INVENTION

1. Field of the Invention

The present invention relates to a process for removing residues from a substrate by treating that substrate with a rinse solution comprising water and at least one selected water-soluble corrosion inhibitor. In particular, the present invention relates to a process for removing a photoresist layer and certain residues from a semiconductor substrate that comprises the steps of removing the photoresist layer from the substrate, preferably with a remover solution, and then removing the residues from the substrate with a rinse solution that comprises water and at least one selected water-soluble corrosion inhibitor.

2. Brief Description of the Art

The manufacture of semiconductor components and integrated circuits is generally carried out using photolithographic processes. These processes involve first coating the semiconductor substrates with photoresist (positive or negative) to form a photoresist layer thereon, followed by imagewise exposing and subsequent developing to form a patterned photoresist layer on the substrate. This patterned layer acts as a mask for actual substrate patterning processes such as etching, doping, coating with metals or other semiconductor materials or other insulating materials.

After these substrate patterning operations, the patterned photoresist structure or layer must be removed from the substrate. In the past, mixtures of polar organic solvents with other compounds such as alkanolamines were used to strip this photoresist layer from the substrates. These solutions are commonly known in the art as photoresist stripping solutions. While these stripping solutions are generally effective, in some cases a small amount of photoresist residue and stripping solution may remain on the surface of the substrate after the stripping operation.

Alternatively, and more preferred at the present time, oxygen gas plasma ashing is used to remove the photoresist layer. This plasma treatment burns the photoresist layer; however, a small amount of photoresist residue, post-etch residue and cleaner solution may remain on the surface of the substrate in some situations.

Other methods for removing the patterned photoresist layer include mechanical means such as scrubbing with a liquid or a gas jet-stream, cryogenic treatment with liquid nitrogen, argon, or supercritical fluids, or by peeling away the layer with an adhesive-coated paper attached to the top of the photoresist layer.

When a liquid photoresist stripper solution or an oxygen gas plasma ashing step was used to remove the patterned photoresist layer, it was common to employ a subsequent liquid rinse operation. Generally, this rinse treatment involved first rinsing the substrate with an organic solvent (e.g., most commonly isopropyl alcohol) followed by a second rinsing operation with deionized water. Besides isopropyl alcohol, specific teachings of alternative organic solvent rinse solutions are described in U.S. Pat. Nos. 4,786,578 (Neisius et al.)(an organic base such as triethanolamine in combination with a non-ionic surfactant); 4,824,762 (Kobayashi et al.) (an ether compound such as dipropyleneglycol monomethyl ether and optionally, an amine compound such as monoethanolamine); and 5,174,816 (Aoyama et al.)(an aqueous solution of a quaternary ammonium hydroxide in combination with a sugar or sugar alcohol). However, the use of such organic solvent-containing rinses are not necessarily desirable because they add complexity to the photoresist removal operation and generate additional solvent waste.

In addition to photoresist residues produced by liquid stripping operations or oxygen gas plasma ashing operations or the like, other residues may form during plasma etching operations used in conjunction with photolithographic processes. For example, as explained in U.S. Pat. No. 5,174,816 (Aoyama et al.) metal halides such as aluminum chlorides may be formed as post-etch residues. Such metal halides may cause corrosion of the substrates when contacted with water.

Furthermore, during anisotropic plasma etching processes for via contacts, metal patterns and possivation openings, post-etch residues may be formed and are know in the art as sidewall polymer residues. After oxygen plasma ashing of the photoresist layer, these sidewall polymer residues become metal oxides. Incomplete removal of these residues interferes with pattern definition and/or complete filling of via holes.

A new class of product called "cleaner solutions" has been developed for removing these post-etch residues, particularly the metal oxide type. These cleaners have generally been described as aqueous solutions of amines or ammonium salts that contain one or more corrosion inhibitors. See U.S. Pat. No. 5,612,304 (Honda et al.). Moreover, alkaline aqueous developers such as those containing tetramethylammonium hydroxide (TMAH) are known to attack aluminum. Thus, aluminum oxide-type residues can be etched away with TMAH. However, other types of the post-etch residues, e.g., metal fluorides such as $AlF_3$ cannot be so easily removed with TMAH without metal layer corrosion. TMAH also is ineffective on residues from polysilicon plasma etch processes.

The metal oxide type sidewall residues can also be removed with: (1) a mixture of hydrofluoric acid and ethylene glycol ether and water, or (2) a mixture of nitric acid, acetic acid, and hydrofluoric acid. However, these solutions require careful process control to prevent excessive attack of critical metal and oxide layers. In some device structures, these solutions are not useful because of their non-selective attack mechanisms. Also, Wai M. Lee described at Interconnects, Contact Metallization and Multilevel Metallization Symposium (183rd Spring Meeting of The Electrochemical Society) in Honolulu, Hi., May 16–21, 1993, that a hydroxylamine-containing amine/water-based stripper composition can remove some kinds of the sidewall residues.

However, there is still a need for better rinse solutions that can be used after either liquid stripper solutions or the new liquid cleaner solutions (or both), or after a dry oxygen gas plasma ashing operation, that will prevent or inhibit corrosion caused by the reaction of water with the above-noted types of residues, yet not contain organic solvents that require special disposal operations. It is believed the present invention offers a solution to that need.

SUMMARY OF THE INVENTION

Accordingly, one embodiment of the present invention is directed to a process for removing residues from a substrate bearing these residues, wherein the residues comprise photoresist residues, post-etch residues, remover solution residues, and combinations thereof, the process comprising treating the residue-bearing substrate with a rinse solution comprising water and an effective corrosion inhibiting amount of at least one water-soluble corrosion inhibitor selected from the group consisting essentially of hydroxylamine, at least one hydroxylammonium salt, at least one water-soluble organic acid, at least one amino acid, or combinations thereof.

Another embodiment of the present invention is directed to a process for removing a patterned photoresist layer and residues which comprise photoresist residues, post-etch residues, remover solution resides, and combinations thereof, from a substrate which has a patterned photoresist layer applied thereon and has been subjected to an etching operation, comprising the steps of:

(1) removing the patterned photoresist layer from the substrate;

(2) treating the substrate with a remover solution; and then (3) rinsing the substrate with a non-corrosive rinse solution comprising water and an effective corrosion-inhibiting amount of at least one water-soluble corrosion inhibitor selected from the group consisting essentially of hydroxylamine, hydroxylammonium salt, at least one water-soluble organic acid, at least one amino acid, or combinations thereof.

DESCRIPTION OF THE PREFERRED EMBODIMENTS

As used herein, the term "photoresist residues" refers to any amounts of a photoresist layer, either patterned or not and either positive or negative, as well as any amounts of degradation products of the photoresist layer remaining on the substrate. The term "post-etch residues" as used herein refers to any amount of residue that remains on a substrate after a plasma etching operation. Such residues include sidewall polymer residues such as metal oxide residues, metal halide residues, fluorinated hydrocarbon polymers, and the like. The term "remover solution residues" as used herein refers to any amounts of a remover solution remaining on a substrate surface after application of the remover solution to the substrate. The term "remover solution" as used herein includes both photoresist stripping solutions and cleaner solutions for removing post-etch residues (e.g., sidewall polymer residues) from substrates. The term "substrate" means any substrate on which a photoresist layer and remover solutions are applied, preferably to a semiconductor substrate.

As defined herein, the term "photoresist stripping" refers to chemical steps or processes that remove photoresist or other similar organic polymeric material from a semiconductor substrate. The term "plasma etch residue cleaning" refers to chemical steps or processes that remove residual materials (also sometimes called sidewall polymers) from a semiconductor substrate that has been subjected to plasma etching. In general, both photoresist stripping and plasma etch residue cleaning may leave residual solvents on the semiconductor substrate surface that result in corrosion of the metal layer of the semiconductor substrate in contact with water if not removed completely by a subsequent rinsing step. As defined herein, the term "non-corrosive" refers to the suppression of any chemical action that gradually wears away a substrate. As used herein, the term "water soluble organic acid" refers to those organic acids that are substantially dissolved in water.

The term "effective corrosion-inhibiting amount" as used herein refers to any amount of the claimed water-soluble corrosion inhibitor that will reduce or prevent corrosion of the substrate from occurring. This amount may vary due to the possible variations in the parameters of the process. Some of these parameters may include the type of substrate, the specific corrosion inhibitors used, the specific corrosive residuals present, the geometry and size of the substrate to be protected against corrosion, the flow velocity of the residuals, temperature, pressure, and the like. The phrase "water-soluble corrosion inhibitor" refers to those corrosion inhibitors that are substantially dissolved in water at a concentration of "effective corrosion-inhibiting amount" at ambient temperatures.

As stated above, the process of the present invention involves treating a residue-bearing substrate with a rinse solution comprising water and an effective corrosion-inhibiting amount of at least one water-soluble corrosion inhibitor. Preferably, this treatment occurs after a removing step wherein a patterned photoresist layer is removed from the substrate. This removing step can be any suitable liquid photoresist stripping step, an oxygen gas plasma ashing operation, or other conventional steps for removing the patterned photoresist layer known in the art. Also, the preliminary removing step may be a plasma-etch residue cleaning step or a combination of a photoresist stripping and plasma-etch residue cleaning steps.

Such removing steps may be performed by any method known in the art of semiconductor manufacturing. Photoresist stripping generally involves removal of photoresist by a chemical stripping agent as discussed above. Plasma etch residue cleaning, on the other hand, is generally conducted by ashing the applied photoresist with a high-energy plasma to form plasma-etch by-products, for example, oxides or halides of aluminum, titanium, copper or related metals such as $AlCl_3$, $AlF_3$, $Al_2O_3$, $SiF_4$, $SiO_2$ and the like, and cleaning the resulting residue with a cleaning composition as described above. In the alternative, a combination of photoresist stripping and plasma etch residue cleaning may be utilized to remove photoresist.

The rinsing step of the method of the invention is employed to rinse the substrate of photoresist stripper or plasma etch residue cleaner that remains on the surface of the substrate in order to minimize corrosion of the substrate. The rinsing composition used in the method of the invention is a non-corrosive rinsing composition that comprises (1) water, and (2) one or more water-soluble corrosion inhibitors.

Water-soluble corrosion inhibitors useful in the method of the present invention include one or more of the following:

(a) hydroxylamine;

(b) at least one hydroxylammonium salt such as hydroxylammonium sulfate (also referred to as HAS), hydroxylammonium nitrate (also referred to as HAN), hydroxylammonium phosphate, hydroxylammonium chloride, hydroxylammonium oxalate, hydroxylammonium citrate, and the like. Alkyl-substituted derivatives of hydroxylammonium salts are also useful, e.g., diethyl hydroxylamine and the like. HAS and HAN are the most preferred hydroxylammonium salts.

(c) at least one water-soluble organic acid such as formic acid, acetic acid, propionic acid, valeric acid, isovaleric acid, oxalic acid, malonic acid, succinic acid (butanediol acid), glutaric acid, maleic acid, fumaric acid, phthalic acid, 1,2,3-benzenetricarboxylic acid, glycolic acid, lactic acid (2-hydroxypropionoic acid), citric acid, salicylic acid, tartaric acid, gluconic acid. Lactic acid, tartaric acid, acetic acid, gluconic acid and phthalic acid are particularly preferred.

(d) at least one amino acid, such as tricine, bicine, DL-homoserine, D-homoserine, L-homoserine, DL-threonine, D-allo-threonine, L-allo-threonine, D-threonine, L-threonine, DL-3-hydroxynorvaline, DL-methyltyrosine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethyltyrosine, (−)-3-(3,4-dihydroxyphenyl)-2-methyl-L-alanine, DL-threo-3-phenylserine, DL-threo-3,4-dihydroxyphenylserine, DL-4-amino-3-hydroxybutyric acid, (3's, 4's)-(−)-statine, (+)-muramic acid, 5-hydroxy-DL-lysine, cis-4-hydroxy-D-proline, cis-4-hydroxy-L-proline, trans-4-hydroxy-L-proline, mimosine, N-(4-hydroxy-phenyl) glycine, 3,3'5-triiodo-L-thyronine, D-thyroxine, L-thyroxine, D-4-hydroxyphenylglycine, 3-nitro-L-tyrosine, 3-amino-L-tyrosine, 3,5-dinitro-L-tyrosine, chloroacetyl-L-tyrosine, N-acetyl-1-tyrosinamine, and the like. More preferable amino acid candidates include tricine, bicine, 3-(3,4-dihydroxyphenyl)-DL-alanine, 3-(2,4,5-trihydroxyphenyl)-DL-alanine, and DL-threo-3,4-dihydroxyphenylserine, in terms of cost/performance balance. Tricine and bicine are the most preferably amino acids.

It has been found that these particular water-soluble corrosion inhibitor compounds can effectively inhibit corrosion without any damage to the substrate. For example, it is believed that corrosion inhibitors having hydroxyl groups can adhere to the substrates through coordination bonding between the hydroxyl groups and metal atoms. This results in protection of the substrate from corrosion.

The preferred amounts of the ingredients in the rinse composition are about 99.99–90% water and about 0.01–10% corrosion inhibitor, all based on the total weight of the rinse composition. The more preferred amounts of the ingredients in the rinse composition are about 99.95–93% water and about 0.05–7% corrosion inhibitor, all based on the total weight of the rinse composition. The most preferred amount of the ingredients in the rinse composition are about 99.9–97% water and about 0.1–3% corrosion inhibitor, all percentages based on the total weight of the rinse composition.

Various other ingredients known to those skill in the art may optionally be included in the rinsing composition e.g. dyes or colorants, wetting agents, surface-active agents, antifoamers and so forth. One useful family of surface-active agents referred to as "SURFYNOL" 400 series surfactants (e.g., SURFYNOL 420 (ethoxylated tetramethyl decynediols)) are commercially available from Air Products Inc. The use of a water-soluble organic acid with a water-soluble surface-active agent in a rinse solution composition is disclosed and claimed in assignees' copending U.S. Patent Application Docket No. 101726-100 filed the same day as this U.S. Patent Application. Generally, the amount of each of these optional ingredients would be about 0.0001–0.1% by weight, based on the total weight of the rinsing composition.

Preparation of the rinsing composition is carried out by dissolving or mixing the selected corrosion inhibitor component(s) with deionized (DI) water, optionally with slight heating to affect dissolution. The resulting solution may be optionally filtered to remove undissolved particles that could harm the substrate.

The described non-corrosive rinse composition is used as a replacement for conventional organic solvents, such as isopropyl alcohol, employed in rinse steps following photoresist stripping or plasma etch residue cleaning. The general procedure for preparing a semiconductor substrate in accordance with the method of the invention is as follows:

A substrate, such as a silicon wafer on which a thin film of oxide is formed is uniformly coated with a photoresist composition in the form of a solution followed by drying to form a photosensitive layer which is then subjected to patterning by pattern-wise exposure to light, development treatment, and post-exposure baking to give a patterned photoresist layer. The oxide film on the substrate surface is selectively etched with the patterned photoresist layer as a mask and then the patterned photoresist layer is completely dissolved away from the substrate surface by chemical stripping or plasma etching. Any remaining chemical stripper or plasma etch residue is removed by a rinsing step using the composition of the invention.

The actual conditions of the rinse (i.e., temperature, time, and the like), may vary over wide ranges and are generally dependent on the nature and amount of photoresist stripper or plasma etch residue cleaner, as well as other factors familiar to those skilled in the art. In general, however, temperatures ranging from about 5° C. to about 40° C. for a period of about 5 seconds to about 15 minutes are typical.

A variety of means can be employed in contacting stripped or cleaned substrates with the rinsing composition in the practice of the method of the invention. For example, the stripped or cleaned substrate can be immersed in a rinse bath, or the rinse composition can be sprayed over the surface of the stripped or cleaned substrate, as will be apparent to those skilled in the art. While not wishing to be bound by any particular theory, it is believed that the composition of the invention provides a higher concentration of corrosion inhibitor than could be reasonably added to the stripper. The concentration of corrosion inhibitor in the rinse composition reduces corrosion of the substrate from any remaining photoresist stripper or plasma etch residue cleaner prior to a deionized water rinse.

The rinsing composition of the invention is effective in removing a wide variety of stripping or cleaning solutions from substrates. Exemplary stripping or cleaning formulations include MICROSTRIP 2001 available from Olin Microelectronic Materials Division of Olin Corporation, EKC 265, EKC 270, EKC 311, EKC 830, all available from EKC Technology, Inc.; ACT 935 available from Ashland Chemical; and PR-2000 available from Baker Chemical. All these materials are effective strippers or plasma etch residue cleaners for organic polymeric materials such as positive- and negative-working g/i-line and deep UV resists, electron beam resists, X-ray resists, ion beam resists, as well as organic dielectric materials such as polyimide resins, and so forth.

The non-corrosive rinse composition can be used to remove stripping formulations applied to any of the conventional substrates known to those skilled in the art, such as silicon, silicon dioxide, silicon nitride, polysilicon, aluminum, aluminum alloys, copper, copper alloys, polyimides, and so forth.

The following Example and Comparison are provided to better illustrate the present invention. All parts and percentages are by weight and all temperatures are in degrees Celsius unless explicitly stated otherwise.

EXAMPLE 1

Silicon wafers having a multi-layer of Al—Si—Cu/$SiO_2$/Si were prepared by plasma deposition method and then top-coated with OiR-32 positive photoresist (PR) available from Olin Microelectronic Materials of East Providence, R.I., which includes a novolak and a naphthoquinone diazide sensitizer. The photoresist was coated a film thickness of about 1.0 micron by spin coating method. Micro-patterning was applied to the PR layer photolithographically, followed by pattern transfer onto the metal layer by plasma etching with a pre-patternized PR mask and $CHF_3$ gas. The wafers were then subjected to oxygen ashing to remove the top layer of photoresist. The plasma-etch residues that remained inside the via holes were characterized by electron spectroscopy, and found to contain $Al_2O_3$ as a major component.

The thus-obtained wafers were immersed in a commercially available stripper solution of EKC 265 (EKC Inc.) held at 65° C. for 30 minutes with gentle agitation. The wafers were removed from the stripper solution bath and immersed in an aqueous solution of hydroxylammonium nitrate (HAN, 0.1 wt %) held at room temperature for 60 seconds with gentle agitation. The wafers were removed from the HAN bath and rinsed with deionized (DI) water for 5 minutes, and dried with a gentle stream of nitrogen gas.

The wafer surface was inspected under a scanning electron microscope (SEM) to observe residue cleaning and metal corrosion of the substrate. SEM results indicated that the residues were completely removed and the metal layer suffered no corrosion.

EXAMPLE 2

The procedure outlined in Example 1 was followed except using a post-strip rinse solution made by dissolving 0.1 grams of lactic acid in 99.9 grams of water. This solution had a pH of 2.9 at 25° C.

The wafer surface was inspected under a scanning electron microscope (SEM) to observe residue cleaning and metal corrosion of the substrate. SEM results indicated that the residues were completely removed and the metal layer suffered no corrosion.

EXAMPLE 3

The procedure outlined in Example 1 was again followed except using a post-strip rinse solution made from 99.94 grams water and 0.06 grams acetic acid. This solution had a pH of 3.4 at 25° C.

The wafer surface was inspected under a scanning electron microscope (SEM) to observe residue cleaning and metal corrosion of the substrate. SEM results indicated that the residues were completely removed and the metal layer suffered no corrosion.

Comparison Example

The same wafers prepared in the Example above were processed identically, except two deionized water rinses were performed following the photoresist stripping step instead of a post-strip rinse followed by a DI water rinse.

SEM results indicated that the residues were completely removed. However, the substrate layer, particularly the TiN layer, suffered severe corrosion.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for removing residues from a substrate bearing said residues, wherein said residues comprise photoresist residues, post-etch residues, remover solution residues and combinations thereof, comprising treating the residue-bearing substrate with a rinse solution comprising about 97 to 99.9 wt. % water and about 0.1 to 3 wt. % of at least one water-soluble corrosion inhibitor selected from the group consisting of hydroxylamine, at least one hydroxylammonium salt, at least one water-soluble organic acid, at least one amino acid, and combinations thereof, wherein the weight percentages are based on the total weight of said rinse solution.

2. The process of claim 1, wherein said water-soluble corrosion inhibitor is hydroxylamine.

3. The process of claim 1, wherein said water-soluble corrosion inhibitor is an hydroxylammonium salt selected from the group consisting essentially of hydroxylammonium nitrate (HAN), hydroxylammonium sulfate (HAS), hydroxylammonium phosphate, hydroxylammonium chloride, hydroxylammonium oxalate, hydroxylammonium citrate, and combinations thereof.

4. The process of claim 1, wherein said water-soluble corrosion inhibitor is at least one water-soluble organic acid.

5. The process of claim 4, wherein said water-soluble organic acid is selected from the group consisting of formic acid, acetic acid, propionic acid, valeric acid, isovaleric acid, oxalic acid, malonic acid, succinic acid (butanediol acid), glutaric acid, maleic acid, fumaric acid, phthalic acid, 1,2, 3-benzenetricarboxylic acid, glycolic acid, lactic acid (2-hydroxypropionoic acid), citric acid, salicylic acid, tartaric acid and gluconic acid.

6. The process of claim 4, wherein said water-soluble organic acid is selected from the group consisting of lactic acid, tartaric acid, acetic acid, gluconic acid and phthalic acid.

7. The process of claim 1, wherein said water-soluble corrosion inhibitor is at least one amino acid.

8. The process of claim 7, wherein said water-soluble corrosion inhibitor is an amino acid selected from the group consisting essentially of tricine, bicine, DL-homoserine, D-homoserine, L-homoserine, DL-threonine, D-allothreonine, L-allo-threonine, D-threonine, L-threonine, DL-3-hydroxynorvaline, DL-methyltyrosine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethyltyrosine, (–)-3-(3,4-dihydroxyphenyl)-2-methyl-L-alanine, DL-threo-3-phenylserine, DL-threo-3,4-dihydroxyphenylserine, and combinations thereof.

9. The process of claim 8, wherein said amino acid is selected from the group consisting essentially of tricine, bicine, 3-(3,4-dihydroxyphenyl)-DL-alanine, 3-(2,4,5-trihydroxyphenyl)-DL-alanine, and DL-threo-3,4-dihydroxyphenylserine.

10. A process for removing a patterned photoresist layer and residues comprising photoresist residues, post-etch residues, remover solution residues and combinations thereof, from a substrate which has a patterned photoresist layer thereon and which has been subjected to an etching operation, comprising the steps of:

(1) removing said patterned photoresist layer from said substrate;

(2) treating said substrate with a remover solution; and (3) rinsing said substrate with a non-corrosive rinse solution comprising about 97 to 99.9 wt. % water and about 0.1 to 3 wt. % of at least one water-soluble corrosion inhibitor selected from the group consisting of hydroxylamine, at least one hydroxylammonium salt, at least one water-soluble organic acid, at least one amino acid, and combinations thereof, wherein the weight percentages are based on the total weight of said non-corrosive rinse solution.

11. The process of claim 10, wherein said water-soluble corrosion inhibitor is hydroxylamine.

12. The process of claim 10, wherein said water-soluble corrosion inhibitor is an hydroxylammonium salt selected from the group consisting essentially of hydroxylammonium nitrate, hydroxylammonium sulfate, hydroxylammonium phosphate, hydroxylammonium chloride, hydroxylammonium oxalate, hydroxylammonium citrate, and combinations thereof.

13. The process of claim 10, wherein said water-soluble corrosion inhibitor is at least one water-soluble organic acid.

14. The process of claim 13, wherein said water-soluble organic acid is selected from the group consisting of formic acid, acetic acid, propionic acid, valeric acid, isovaleric acid, oxalic acid, malonic acid, succinic acid (butanediol acid), glutaric acid, maleic acid, fumaric acid, phthalic acid, 1,2,3-benzenetricarboxylic acid, glycolic acid, lactic acid (2-hydroxypropionoic acid), citric acid, salicylic acid, tartaric acid and gluconic acid.

15. The process of claim 14, wherein said water-soluble organic acid is selected from the group consisting of lactic acid, tartaric acid, acetic acid, gluconic acid and phthalic acid.

16. The process of claim 10, wherein said water-soluble corrosion inhibitor is at least one amino acid.

17. The process of claim 10, wherein said water-soluble corrosion inhibitor is an amino acid selected from the group consisting essentially of tricine, bicine, DL-homoserine, D-homoserine, L-homoserine, DL-threonine, D-allo-threonine, L-allo-threonine, D-threonine, L-threonine, DL-3-hydroxynorvaline, DL-methyltyrosine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethyltyrosine, (−)-3-(3,4-dihydroxyphenyl)-2-methyl-L-alanine, DL-threo-3-phenylserine, DL-threo-3,4-dihydroxyphenylserine, and combinations thereof.

18. The process of claim 17, wherein said amino acid is selected from the group consisting essentially of tricine, bicine, 3-(3,4-dihydroxyphenyl)-DL-alanine, 3-(2,4,5-trihydroxyphenyl)-DL-alanine, and DL-threo-3,4-dihydroxyphenylserine.

19. The process of claim 10, wherein said removing steps (1) and (2) each comprise a liquid photoresist stripping step.

20. The process of claim 10, wherein said removing step (1) comprises an oxygen gas plasma ashing operation.

21. The process of claim 10, wherein steps (1) and (2) are carried out simultaneously.

22. The process of claim 10, wherein step (2) is a post-etch cleaning step.

* * * * *